(12) United States Patent
Ishido et al.

(10) Patent No.: US 8,945,466 B2
(45) Date of Patent: Feb. 3, 2015

(54) COMPOSITE MATERIAL FOR HEAT DISSIPATING PLATE AND METHOD OF PRODUCTION OF SAME

(75) Inventors: Kaoru Ishido, Shizuoka (JP); Hideki Ishii, Shizuoka (JP); Shigehisa Watanabe, Shizuoka (JP); Hisashi Hori, Shizuoka (JP)

(73) Assignee: Nippon Light Metal Company, Ltd., Tokyo (JP)

( * ) Notice: Subject to any disclaimer, the term of this patent is extended or adjusted under 35 U.S.C. 154(b) by 0 days.

(21) Appl. No.: 14/112,956

(22) PCT Filed: Jul. 11, 2012

(86) PCT No.: PCT/JP2012/004490
§ 371 (c)(1),
(2), (4) Date: Oct. 21, 2013

(87) PCT Pub. No.: WO2013/011668
PCT Pub. Date: Jan. 24, 2013

(65) Prior Publication Data
US 2014/0037934 A1  Feb. 6, 2014

(30) Foreign Application Priority Data

Jul. 15, 2011 (JP) ................. 2011-156819

(51) Int. Cl.
*B22F 3/10* (2006.01)
*B22F 3/17* (2006.01)
(Continued)

(52) U.S. Cl.
CPC .............. *B22D 19/14* (2013.01); *C22C 1/0416* (2013.01); *C22C 1/10* (2013.01); *C22C 21/00* (2013.01); *C22C 21/02* (2013.01); *H01L 23/3736* (2013.01); *B22F 2998/00* (2013.01)
USPC .................. 419/14; 419/28; 419/47; 148/513

(58) Field of Classification Search
USPC ................................................ 419/14, 26, 28
See application file for complete search history.

(56) References Cited

U.S. PATENT DOCUMENTS

| 4,759,995 A | 7/1988 | Skibo et al. |
| 5,000,246 A | 3/1991 | Dwivedi et al. |

(Continued)

FOREIGN PATENT DOCUMENTS

| JP | 01-501489 | 5/1989 |
| JP | 02-243729 | 9/1990 |

(Continued)

OTHER PUBLICATIONS

The International Bureau of WIPO, "Notification of Transmittal of Translation" and "International Preliminary Report on Patentability," WIPO (Switzerland), (Jan. 30, 2014).

*Primary Examiner* — George Wyszomierski
*Assistant Examiner* — Ngoclan T Mai
(74) *Attorney, Agent, or Firm* — Hammer & Associates, P.C.

(57) ABSTRACT

There is provided a composite material for a heat dissipating plate which achieves both a high thermal conductivity and a low coefficient of thermal expansion and has a performance satisfactory as a heat dissipating plate and a method of production of a composite material which can produce the composite material at a low cost. For this reason, powder metallurgy is used to produce the composite material for a heat dissipating plate. The composite material for a heat dissipating plate which is fabricated by this method of production contains an aluminum alloy and silicon carbide. The particles of silicon carbide are in contact with each other.

4 Claims, 4 Drawing Sheets

(51) Int. Cl.
*B22D 19/14* (2006.01)
*C22C 1/04* (2006.01)
*C22C 1/10* (2006.01)
*C22C 21/00* (2006.01)
*C22C 21/02* (2006.01)
*H01L 23/373* (2006.01)

(56) References Cited

U.S. PATENT DOCUMENTS

| | | | |
|---|---|---|---|
| 6,183,874 B1 | 2/2001 | Yamagata et al. | |
| 6,280,496 B1 * | 8/2001 | Kawai et al. | 75/236 |
| 7,364,692 B1 * | 4/2008 | Spowart et al. | 419/17 |
| 7,528,413 B2 | 5/2009 | Yoshida et al. | |
| 7,749,430 B2 * | 7/2010 | Fukui | 419/26 |
| 2008/0131719 A1 * | 6/2008 | Okaniwa et al. | 428/564 |

FOREIGN PATENT DOCUMENTS

| | | |
|---|---|---|
| JP | 09-157773 | 6/1997 |
| JP | 10-335538 | 12/1998 |
| JP | 11-106848 | 4/1999 |
| JP | 2000-192168 | 7/2000 |
| JP | 2001-158933 | 6/2001 |
| JP | 2003-078087 | 3/2003 |
| JP | 2004-003023 | 1/2004 |
| WO | WO 03/040420 A1 | 5/2003 |

\* cited by examiner

COMPOSITE MATERIAL FOR HEAT DISSIPATING PLATE AND METHOD OF PRODUCTION OF SAME

TECHNICAL FIELD

The present invention relates to a composite material for a heat dissipating plate and a method of production of the same, more particularly relates to a composite material for a heat dissipating plate containing aluminum and silicon carbide and a method of production of the same.

BACKGROUND ART

In the past, a semiconductor device has been utilized not only for control of an electromagnetic signal in a computer, but also for power control of a power source in industrial equipment such as electrical cars of railroads, electric vehicles, machine tools, refrigerating machines, etc. Since the semiconductor device which is utilized for such power control is designed for control of power, it generates a large amount of heat. A board on which such a semiconductor device is mounted is required to have a high heat dissipating efficiency.

As a material of a heat dissipating plate on which a semiconductor device for power control is mounted and which dissipates heat generated from the semiconductor device, in the past, high thermal conductivity copper and copper alloy have been utilized.

However, copper and a copper alloy have larger coefficient of thermal expansion compared with the silicon, gallium arsenide, etc. forming the semiconductor device. Accordingly, generation of heat by the semiconductor device sometimes caused cracks to form due to the difference in coefficient of thermal expansion between the semiconductor device and the heat dissipating plate. The formation of such cracks as a result sometimes becomes a factor causing the deterioration of heat dissipating property of the semiconductor device and destruction of the semiconductor device.

For this reason, when reliability of the semiconductor device is particularly necessary, from the viewpoint of preventing the occurrence of cracks due to the difference in coefficient of thermal expansion between the semiconductor device and the heat dissipating plate, molybdenum, tungsten, or their alloys have been utilized for the materials for the heat dissipating plate.

However, these materials of heat dissipating plates have the defect of low thermal conductivities. Increasing the volume of the heat dissipating plate to make up for the defect of the low thermal conductivities leads to an increase in mass due in part to the large densities of these materials.

Therefore, to improve the ease of handling and the running performance in transport equipment such as electric cars of railroads and electric vehicles, a heat dissipating plate of a semiconductor device for power control use which realizes a high thermal conductivity and a lower coefficient of thermal expansion and which is light in weight has been desired.

To meet these requirements for a heat dissipating plate, Patent Document 1 and Patent Document 2 propose a composite material of copper and diamond, and a composite material of copper and copper (I) oxide respectively.

However, although the composite material which is disclosed in Patent Document 1 achieves both a thermal conductivity over 600 W/(m·K) and a coefficient of thermal expansion under $5\times10^{-6}$, it has the defect that it is high in cost and further is inferior in cuttability when adjusting the dimensions etc because it utilizes diamond.

On the other hand, the composite material which is disclosed in Patent Document 2 achieves both a thermal conductivity over 200 W/(m·K) and a coefficient of thermal expansion under $16\times10^{-6}$. In addition it is easy to produce and realize at a low cost. However, since the densities of copper and copper (I) oxide are respectively 8.9 kg/dm$^3$ and 6.4 kg/dm$^3$, the requirements for lighter weight is not satisfied.

Therefore, as art relating to the composite material satisfying such requirements for lighter weight, Patent Documents 3 to 7 all propose composite materials which contain aluminum alloy and silicon carbide. Since the composite materials described in Patent Documents 3 to 7 have densities of aluminum alloy and silicon carbide of respectively around 2.7 kg/dm$^3$ and around 3.2 kg/dm$^3$, they satisfy the requirements for lighter weight.

The art disclosed in Patent Document 3 is a method of production of a composite material by so-called impregnation. Specifically, this is the method of molding particles or fibers of silicon carbide to form aggregates of particles or fibers of silicon carbide, that is, porous preforms, bringing them into contact with molten aluminum, and impregnating the voids in the porous preforms with the molten aluminum alloy.

Further, the art disclosed in Patent Document 4 is a method of production of a composite material by so-called casting. Specifically, it is a method of mixing molten aluminum alloy and particles of silicon carbide, then casting them.

Further, the arts disclosed in Patent Document 5, Patent Document 6, and Patent Document 7 are methods of production of composite materials of aluminum alloy and silicon carbide by so-called powder metallurgy. Specifically, they are methods of mixing aluminum powder or powder of aluminum alloy and particles of silicon carbide, then sintering them.

CITATIONS LIST

Patent Literature

Patent Document 1: WO2003/040420
Patent Document 2: JP 2004-003023A
Patent Document 3: JP 2-243729A
Patent Document 4: JP 1-501489A
Patent Document 5: JP 9-157773A
Patent Document 6: JP 10-335538A
Patent Document 7: JP 11-106848A

SUMMARY OF INVENTION

Problem to be Solved

However, in the above impregnation, after the porous preform is shaped, the voids of the porous preform are impregnated with the molten aluminum alloy. Accordingly, multiple stages of work are required. Therefore, while a composite material which is suitable for use for a heat dissipating plate is obtained, there was the defect that the cost became remarkably high.

On the other hand, although casting and powder metallurgy enable the costs to be kept low, there are limits to the ratio of mixture of the mixable particles of silicon carbide. Therefore it was difficult to achieve both a high thermal conductivity and a low coefficient of thermal expansion.

In particular, in casting, if the ratio of particles of silicon carbide is increased, the mixture of the molten aluminum alloy and the silicon carbide becomes lower in fluidity, the castability deteriorates, and the silicon carbide segregates in the mixture. As a result, the ratio of the silicon carbide in the mixture cannot be made 50% or more and a heat dissipating plate of a satisfactory performance is difficult to obtain.

Note that, it is possible to increase the ratio of particles of silicon carbide in case of powder metallurgy rather than that in case of casting. However, the art described in Patent Document 5 utilizes not an aluminum alloy, but purity 99% or more aluminum, so the sintering temperature has to be made 660° C. or more. That is, tremendous time and cost are required for the heating for sintering. Further, there were the defects that the thermoforming mold has to be made of expensive graphite or ceramic etc. and the cost becomes higher.

Here, according to the research of the present inventors, it is learned that there is the defect that when changing the thermoforming mold to one made of a ferrous metal, the lifetime of the thermoforming mold is short and the cost becomes higher.

Further, the art which is described in Patent Document 6 provides a semiconductor board material comprised of aluminum or an aluminum alloy in which silicon carbide is dispersed in a particle form. However, according to this art, as the sintering atmosphere, a 99 vol % or more nitrogen atmosphere, an oxygen concentration 200 ppm or less atmosphere, or a condensation point −20° C. or less atmosphere is necessary. Accordingly, it is learned that there was the defect that the cost became high.

Furthermore, the art described in Patent Document 7 utilizes a plurality of ceramic particles of different average particle sizes and requires preshaping under conditions of 100° C. to 400° C. and 30 MPa to 300 MPa. Accordingly, it has the defect of a high cost.

Therefore, the present invention is focusing on the above problems and has as its object the provision of a composite material for a heat dissipating plate which achieves a high thermal conductivity and low coefficient of thermal expansion and has satisfactory performance as a heat dissipating plate and a method of production of a composite material which can produce a composite material at a low cost.

Solution to Problem

To solve this problem, the inventors engaged in intensive studies and as a result discovered that if the particles of silicon carbide of the composite material of an aluminum alloy and silicon carbide for a heat dissipating plate contact each other, both a high thermal conductivity and a low coefficient of thermal expansion can be achieved.

The present invention is based on this discovery by the inventors. The method of production of a composite material for a heat dissipating plate according to an embodiment of the present invention for solving this problem includes a mixing step of mixing a powder of an aluminum alloy and particles of silicon carbide to obtain a mixture, a heating step of heating the mixture filled in an aluminum case, and a forging step of forging the mixture in a semi-molten state where the aluminum alloy is a molten state, wherein the particles of silicon carbide contact each other.

Further, in the method of production of a composite material for a heat dissipating plate according to another embodiment of the present invention, the aluminum alloy may be an Al—Si alloy.

Further, in the method of production of a composite material for a heat dissipating plate according to another embodiment of the present invention, the Al—Si alloy may be Al-(7 to 11) mass % Si.

Further, in the method of production of a composite material for a heat dissipating plate according to another embodiment of the present invention, a heating temperature at the heating step is a temperature of a liquidus temperature of the aluminum alloy or more and 650° C. or less.

Further, in the method of production of a composite material for a heat dissipating plate according to another embodiment of the present invention, the forging conditions at the forging step may be 100 MPa to 300 MPa pressure for 1 second to 20 seconds.

Further, the composite material for a heat dissipating plate according to an embodiment of the present invention is obtained by the method of production of a composite material for a heat dissipating plate.

Further, the composite material for heat dissipating plate according to another embodiment of the present invention is produced by using powder metallurgy, contains an aluminum alloy and silicon carbide, and has the particles of silicon carbide in contact with each other.

Advantageous Effects of the Invention

According to the method of production of a composite material for a heat dissipating plate of the present invention, since powder metallurgy is used to fabricate a composite material for a heat dissipating plate, the cost is low. Further, the composite material for a heat dissipating plate of the present invention achieves both a high thermal conductivity and a low coefficient of thermal expansion, is light in weight, is low in Young's modulus, and is improved in adhesion with a semiconductor device. Accordingly, it has suitable performance as a heat dissipating plate of a semiconductor device for power control use.

DESCRIPTION OF EMBODIMENTS

Below, a composite material for a heat dissipating plate and a method of production of the same of embodiments of the present invention will be explained with reference to the drawings.

Method of Production of Composite Material for Heat Dissipating Plate

The method of production of a composite material for a heat dissipating plate of the present embodiment (below, sometimes referred to as a "composite material") includes at least a mixing step, heating step, and forging step. Note that, between the mixing step and the heating step, a preshaping step may be included.

Mixing Step

The mixing step is a step of uniformly mixing at least the powder of the aluminum alloy and particles of silicon carbide to obtain a mixture.

Powder of Aluminum Alloy

As the powder of aluminum alloy, a powder of Al—Si alloy is preferable, and Al-(7 to 11) mass % Si is more preferable. If the content of Si in the Al—Si alloy is less than 7 mass %, the effect of improvement of the fluidity by the inclusion of Si is low. Accordingly, this is not preferable. On the other hand, if the content of Si in the Al—Si alloy is over 11 mass %, an Al—Si-based eutectic structure grows and the machineability after solidification falls. Accordingly, this is not preferable.

Further, although the particle size of the powder of the aluminum alloy is not particularly limited, 10 μm to 100 μm is preferable, and 25 to 60 μm is more preferable. If the particle size is over 100 μm, in the mixing step, uniform mixing with the particles of silicon carbide becomes difficult. On the other hand, if the particle size is smaller than 10 μm, the particles easily float in the air and handling becomes no longer easy. Further, the powder of the aluminum alloy may be mixed with a plurality of types of the powder of the aluminum alloy with different Si contents to give Al-(7 to 11) mass % Si alloy. As the particle sizes of the plurality of types of the powder of the aluminum alloy with different Si contents, 10 μm to 100 μm is preferable, while 25 μm to 60 μm is more preferable. Further, the particle sizes of the plurality of types of the powder of the aluminum alloy with different Si contents may be different from each other.

Note that, the particle size of the powder of the aluminum alloy shows the value obtained by the laser diffraction type particle size analysis measurement method. Further, the shape of the powder of the aluminum alloy is not particularly limited and, for example, may be any of a teardrop shape, spherical shape, spheroid shape, flake shape, irregular shape, etc.

Particles of Silicon Carbide

As the particles of silicon carbide, particles of green color silicon carbide or particles of black color silicon carbide may be used. The particle size of the particles of silicon carbide is not particularly limited, but 10 μm to 100 μm is preferable and 25 μm to 60 μm is more preferable. If the particle size is over 100 μm, in the mixing step, uniform mixing with the particles of the aluminum alloy becomes difficult. On the other hand, if the particle size of the particles of silicon carbide is smaller than 10 μm, the particles easily float in the air and handling becomes no longer easy.

Note that, the particle size of the particles of silicon carbide shows the value obtained by the laser diffraction type particle size analysis measurement method. Further, the shape of the particles of silicon carbide is not particularly limited and, for example, may be any of a teardrop shape, spherical shape, spheroid shape, flake shape, irregular shape, etc.

Mixing Ratio

The mixing ratio of the powder of the aluminum alloy and the particles of silicon carbide is preferably a mass ratio of 30:70 to 60:40.

Here, if the mixing ratio is over 30:70, that is, if the particles of silicon carbide are greater, after the "forging step", voids remain in the obtained composite material. Accordingly, a high thermal conductivity cannot be obtained. As a result, the composite material does not have a satisfactory performance for a heat dissipating plate of a semiconductor device for power control use.

Further, if the mixing ratio is over 60:40, that is, if the powder of the aluminum alloy is greater, after the "forging step", the particles of silicon carbide which form the obtained composite material are separated by the powder of the aluminum alloy. Accordingly, a low coefficient of thermal expansion cannot be obtained. As a result, the composite material does not have a satisfactory performance for a heat dissipating plate of a semiconductor device for power control use.

As the method of mixing the powder of the aluminum alloy and the particles of silicon carbide, a known method may be employed. For example, a V blender, cross rotary mixer, or other mixer, a vibrating mill, a planetary mill, etc. is preferably used for mixing for one hour to around six hours.

Preshaping Step

The preshaping step is a step of compressing the mixture which was obtained at the mixing step at room temperature or room temperature to 300° C. in temperature range at 200 MPa to 1000 MPa in pressure by a press or hydrostatic pressure under pressure. This preshaping step can be omitted, but by working this step, the filling of the mixture into the aluminum case in the later explained heating step becomes easy. Note that, in the present step, if the press or hydrostatic pressure is less than 200 MPa, there is no significant effect of the preshaping. On the other hand, it is sufficient if the hydrostatic pressure is 1000 MPa. There is no need to apply a pressure above that.

Heating Step

The heating step is a step of filling and heating the mixture in an aluminum case.

Heating Temperature

The heating temperature in this step differs depending on the composition of ingredients of the powder of the aluminum alloy, but it is a temperature of the liquidus temperature where the aluminum alloy becomes a molten state or more and 650° C. or less. For example, if the composition of ingredients of the powder of the aluminum alloy is Al-11 mass % Si, the liquidus line temperature is 590° C. Accordingly, the heating temperature becomes within a range of 590 to 650° C. If the heating temperature is less than the liquidus temperature of the aluminum alloy, the aluminum alloy will not become a molten state, so the forging step cannot be performed. On the other hand, if the heating temperature exceeds 650° C., the cost required for the heating increases. Further, the surface oxide film of the molten state aluminum alloy becomes thicker and the apparent fluidity falls. As a result, in the forging step, the required pressure and required time increase. Accordingly, this is not preferred.

Heating Atmosphere

The atmosphere during the heating in this step is not particularly limited. It may be set to the air, a nitrogen gas, an argon gas, a vacuum, or another atmosphere. If it is set to the air, the cost can be lowered. Accordingly, this is preferable.

Holding Time

In the present step, the holding time for holding until the next forging step is preferably 10 minutes to 200 minutes from when the mixture reaches the liquidus line temperature to 650° C. If the holding time is less than 10 minutes, as explained above, when mixing a plurality of types of powder of aluminum alloy with different Si contents, the composition of ingredients of the aluminum alloy does not become uniform. On the other hand, if the holding time exceeds 200 minutes, the cost required for heating increases. In addition, the surface oxide film of the molten state aluminum alloy becomes thicker and the apparent fluidity falls. As a result, in the forging step, the required pressure and required time increase. Accordingly, this is not preferred.

Forging Step

The forging step is a step of forging the mixture in the semi-molten state, where the aluminum alloy is in the molten state by the heating step, at a predetermined pressure for a predetermined time. Note that, in this step, the aluminum alloy is kept from solidifying by forging while holding the mixture at a temperature of the liquidus line temperature of the aluminum alloy or more and 650° C. or less.

Forging Conditions

The forging conditions in this step are preferably application of 100 MPa to 300 MPa pressure for 1 second to 20 seconds. If the pressure is less than 100 MPa, voids remain in the obtained composite material. Accordingly, a high thermal conductivity cannot be obtained. It is sufficient if the pressure is 300 MPa. There is no need to apply a pressure over that.

Further, if the forging time is less than 1 second, voids remain in the composite material. Accordingly, a high thermal conductivity cannot be obtained. It is sufficient if the forging time is 20 seconds. There is no need to apply forging for over that time. The composite material which is filled in the aluminum case after forging in the semi-molten state is cooled down to room temperature while filled in the aluminum case. After this, the cooled composite material is shaped as a heat dissipating plate by cutting off the aluminum case by machining if necessary.

Heat Dissipating Plate

Figure 1:
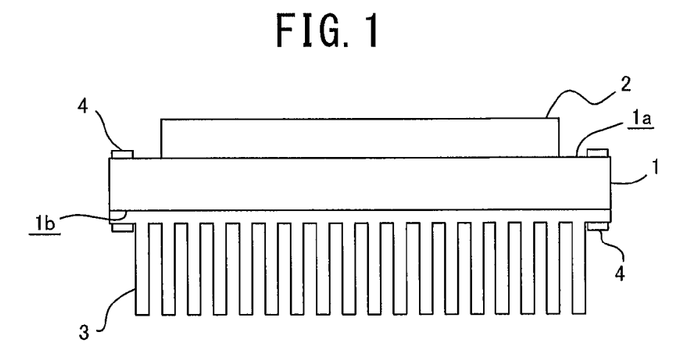
FIG. 1 is a front view which shows the configuration of a heat dissipating plate which is fabricated by the composite material of a heat dissipating plate of the present embodiment.

FIG. 1 is a front view which shows the configuration of a heat dissipating plate which is comprised of a composite material which is fabricated by the method of production of the composite material of the present embodiment. As shown in FIG. 1, a rectangular shaped heat dissipating plate 1 has a semiconductor device 2 for power control use mounted on its front surface 1a. The semiconductor device 2 is, for example, a semiconductor device comprised of silicon. Further, the semiconductor device 2 is soldered or brazed on to the surface 1a for the purpose of heat conduction. On the other hand, on the back surface 1b of the heat dissipating plate 1, a heat sink 3 which has a large number of fins is fastened by bolts 4 to the heat dissipating plate 1 through not shown thermal grease. These bolts 4 are set not only to fasten the heat sink 3 to the heat dissipating plate 1, but also assist heat conduction. Therefore, the bolt 4 is preferably comprised of a material with a high thermal conductivity.

The heat dissipating plate 1 on which the semiconductor device 2 is mounted and to which the heat sink 3 is attached is provided for efficiently conducting the heat generated from the semiconductor device 2 to the heat sink 3 for dissipation. That is, the heat dissipating plate 1 has to be excellent in thermal conductivity, coefficient of thermal expansion, and Young's modulus in order to achieve efficient heat dissipation.

Therefore, the composite material which is produced by the method of production of the composite material of the present embodiment has satisfactory performance as a heat dissipating plate of a semiconductor device for power control use since the particles of silicon carbide which form the composite material contact each other. Here, "the particles of silicon carbide contact each other" means the particles of silicon carbide continuously contact each other from one surface of the composite material of the present embodiment (for example, front surface in thickness direction) to the opposite side surface (for example, back surface in thickness direction). Note that, the "one surface" and "opposite side surface" may also be "one surface" and "an opposite side other surface" of a piece of a composite material cut in any range as a sample. That is, in the composite material of the present embodiment, whether or not cutting the composite material, it is sufficient that the particles of silicon carbide are in continuous contact from one surface to the opposite side surface.

Specifically, the Al-(7 to 11) mass % Si alloy which is used in the present embodiment is lower than pure aluminum in liquidus line temperature. In addition, it is high in fluidity and high in wettability with silicon carbide (low in surface energy) even if melted in the air. Therefore, as shown in Patent Document 5, there is no need to make the heating temperature 660° C. or more. Even if making the thermoforming mold a ferrous metal, the lifetime can be sufficiently longer.

Further, the composite material of the present embodiment, as shown in Patent Document 6, does not have to be a 99 vol % or more nitrogen atmosphere, an oxygen concentration 200 ppm or less atmosphere, or a condensation point −20° C. or less atmosphere. Therefore, even if worked in the air, the particles of silicon carbide which form the composite material contact each other and, as a result, both a high thermal conductivity and a low coefficient of thermal expansion are realized. Accordingly, it is possible to obtain a composite material which has a performance able to satisfy the requirements of a heat dissipating plate of a semiconductor device for power control use.

Furthermore, the composite material of the present embodiment is obtained by filling a mixture of the powder of the aluminum alloy and particles of silicon carbide into an aluminum case, heating it, and forging it in a semi-molten state. Accordingly, the preshaping such as shown in Patent Document 7 may be omitted. Even if performing the preshaping, it may be performed at room temperature or from room temperature to 300° C. in temperature range.

Note that, the method of production of the composite material of the present embodiment employs powder metallurgy. Accordingly, even if the particles of silicon carbide which form the obtained composite material contact each other, they just contact each other. That is, this is not a case like the composite material of aluminum alloy and silicon carbide which is formed by impregnation where the particles of silicon carbide are chemically bonded as a porous preform. In particular, in the composite material of the present embodiment, the particles of silicon carbide continuously contact each other from one surface to the opposite side other surface. Therefore, the composite material which is obtained by the method of production of the composite material of the present embodiment can be given a Young's modulus of 190 GPa or less. Due to this, it is possible to ease the stress which occurs due to the difference in coefficient of thermal expansion with the semiconductor device and possible to improve the adhesion with the semiconductor device.

In addition, the method of production of a composite material of the present embodiment is powder metallurgy, so is lower in cost than the arts which are disclosed in Patent Documents 1 to 7. Therefore, it is possible to provide a composite material which has a performance able to satisfy the requirements of a heat dissipating plate on which a semiconductor device for power control use is mounted.

As explained above, according to the method of production of a composite material of the present embodiment, it is possible to fabricate a heat dissipating plate of a semiconductor device for power control use comprised of a composite material of an aluminum alloy and silicon carbide with at least a suitable Young's modulus at a low cost.

EXAMPLES

Below, examples of a composite material for a heat dissipating plate and a method of production of the same according to the present invention will be explained.

Example 1

A powder of pure aluminum of an average particle size of 30 μm and a powder of Al-11 mass % Si of an average particle size of 54 μm were mixed so as to give a composition of ingredients of aluminum alloy of Al-8.3 mass % Si. With this powder of aluminum alloy, particles of green color silicon carbide of an average particle size of 40 μm were mixed to give a mass ratio of the powder of the aluminum alloy:particles of green color silicon carbide=46:54 by a V blender for 3 hours (mixing step). Note that, the mixing ratio of the powder of the aluminum alloy and the particles of green color silicon carbide is a volume ratio of 50:50. Further, the liquidus line temperature of Al-8.3 mass % Si is 607° C.

The obtained mixture was preshaped at room temperature and a 300 MPa pressure by a press and filled into an aluminum case. The mixture which was filled into the aluminum case was heated to a temperature from the liquidus line temperature to 650° C., that is, 620° C., to make the aluminum alloy melt (heating step).

After this, the heated mixture was held for 30 minutes, then was acted on by a 220 MPa pressure for 5 seconds for semi-molten forging (forging step) to obtain a composite material of an aluminum alloy and silicon carbide.

Comparative Example 1

Except for making the heating temperature in the heating step of Example 1 a temperature of less than the liquidus line temperature, that is, 520° C., the same procedure was followed as in Example 1 to obtain a composite material.

Comparative Example 2

Except for making the heating temperature in the heating step of Example 1 a temperature of less than the liquidus line temperature, that is, 560° C., the same procedure was followed as in Example 1 to obtain a composite material.

Comparative Example 3

Particles of green color silicon carbide with an average particle size of 40 μm were mixed with powder of pure aluminum with an average particle size of 30 μm to give a mass ratio of aluminum powder:particles of green color silicon carbide=46:54 by a blender for 3 hours (mixing step).

Next, the obtained mixture was preshaped by pressing at room temperature by a 300 MPa pressure and filled in an aluminum case (preshaping step).

After this, the mixture filled in the aluminum case was heated to a temperature of less than the liquidus line temperature of a powder of pure aluminum, that is, 620° C. (heating step). Due to this step, the pure aluminum did not melt.

After this, the heated mixture was held for 30 minutes, then was pressed by 220 MPa of pressure for 5 seconds for hot forging to obtain a composite material of pure aluminum and silicon carbide.

Evaluation of Composite Material
Examination of Cross-Sectional Structure
The composite materials of Example 1 and Comparative Examples 1 to 3 which were obtained in the above way were observed for cross-sectional structure by an optical microscope. The results of observation are shown in FIG. 2 to FIG. 5.

In FIG. 2 to FIG. 5, the parts which are observed as white are the aluminum or its alloy, the parts which are observed as gray are particles of silicon carbide, and the parts which are observed as black are voids.

Figure 2:
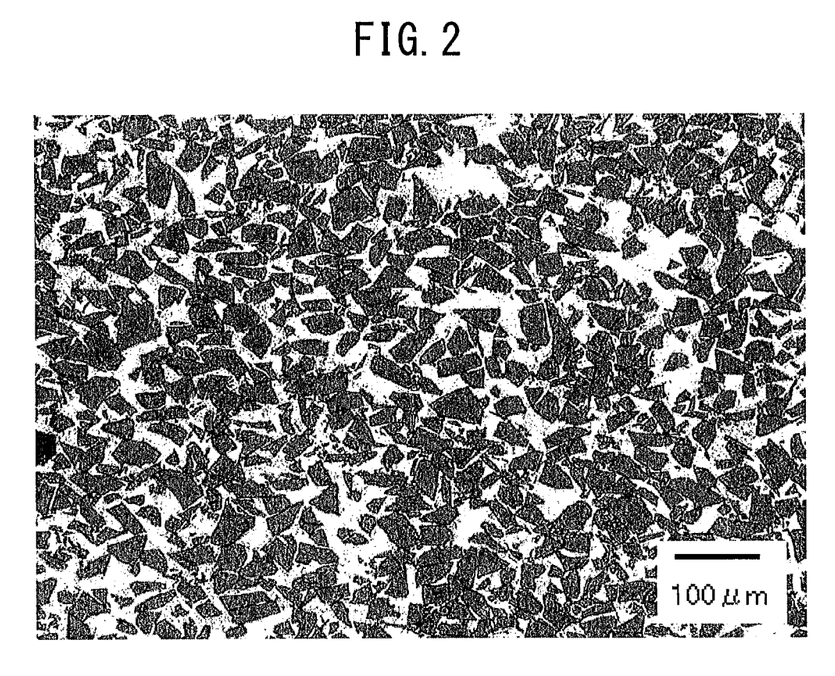
FIG. 2 is a micrograph which shows a cross-sectional structure of a composite material of Example 1.

As shown in FIG. 2, in the cross-sectional structure of a composite material of Example 1, it is learned that the particles of silicon carbide which are observed as gray contact each other and there are almost no voids which are observed as black.

Figure 3:
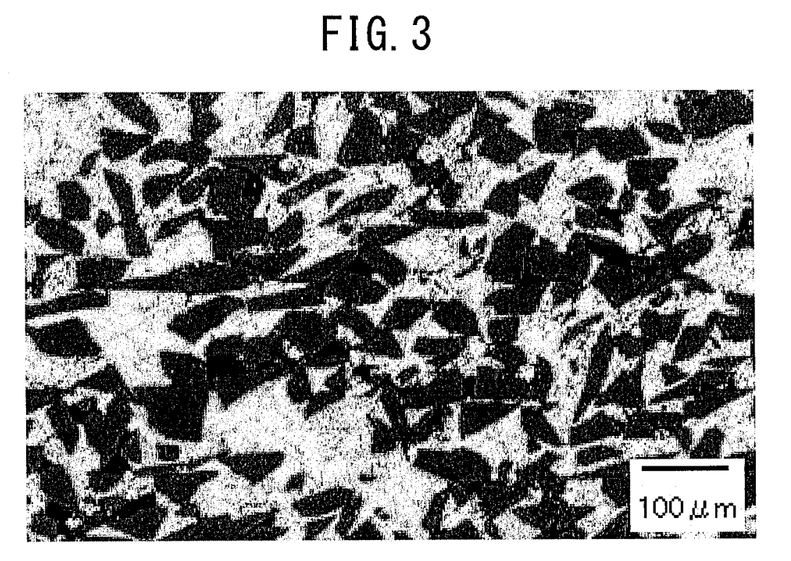
FIG. 3 is a micrograph which shows a cross-sectional structure of a composite material of Comparative Example 1.
Figure 4:
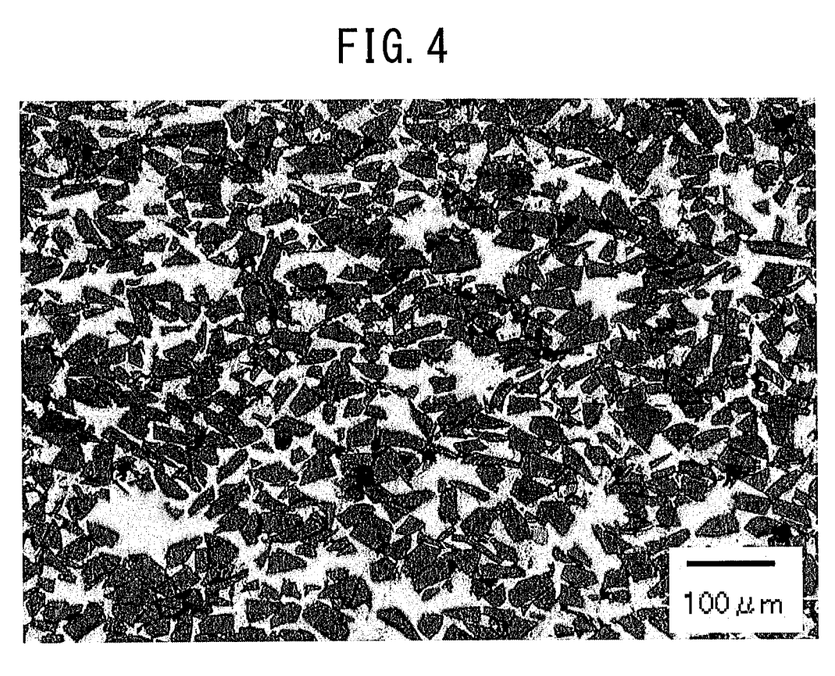
FIG. 4 is a micrograph which shows a cross-sectional structure of a composite material of Comparative Example 2.

On the other hand, as shown in FIG. 3 and FIG. 4, in the cross-sectional structures of the composite materials of Comparative Example 1 and Comparative Example 2, it is learned that the heating temperature is less than the liquidus temperature of aluminum alloy and the aluminum alloy does not become a molten state, so the semi-molten forging is insufficient and numerous voids observed as black remain.

Figure 5:
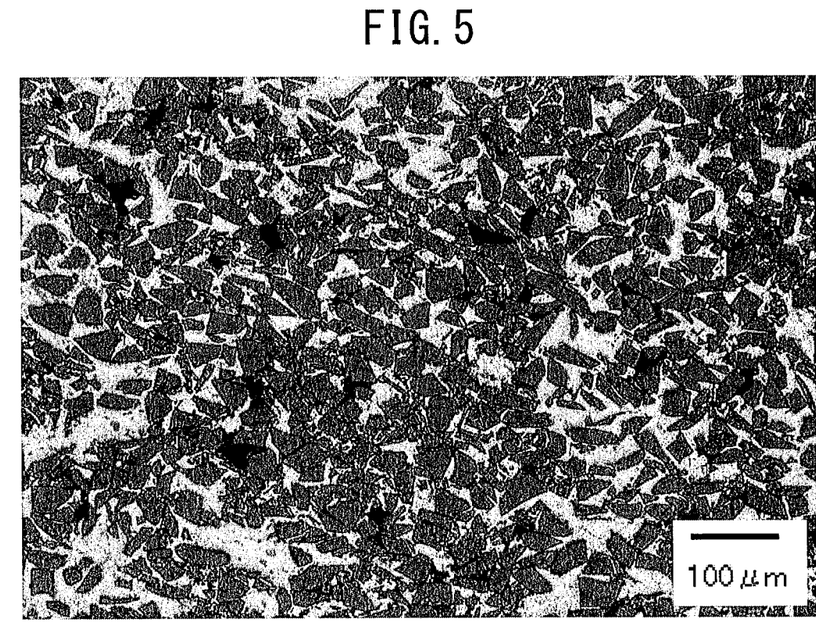
FIG. 5 is a micrograph which shows a cross-sectional structure of a composite material of Comparative Example 3.

On the other hand, as shown in FIG. 5, in the cross-sectional structure of a composite material of Comparative Example 3, it is learned that since pure aluminum is used, the fluidity is low and, also, the heating temperature is less than the liquidus line temperature of aluminum and the aluminum alloy does not become a molten state, so the semi-molten forging is insufficient and numerous voids observed as black remain.

Further, to clarify the fact that the particles of silicon carbide are in contact, micrographs of the cross-sectional structures of composite materials of Example 1 and Comparative Example 1 were analyzed by image analysis to convert them for binarization to make the parts of particles of silicon carbide black and make other parts white. These results are shown in FIG. 6 and FIG. 7.

Figure 6:
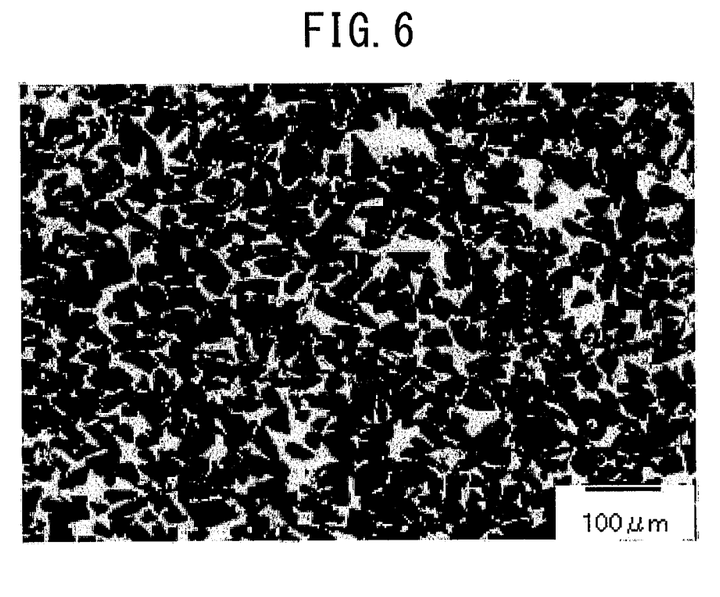
FIG. 6 is a micrograph of the cross-sectional structure of a composite material of Example 1 which is shown in FIG. 2 which is converted in image by image analysis to make the parts of the particles of silicon carbide black and make the other parts white.
Figure 7:
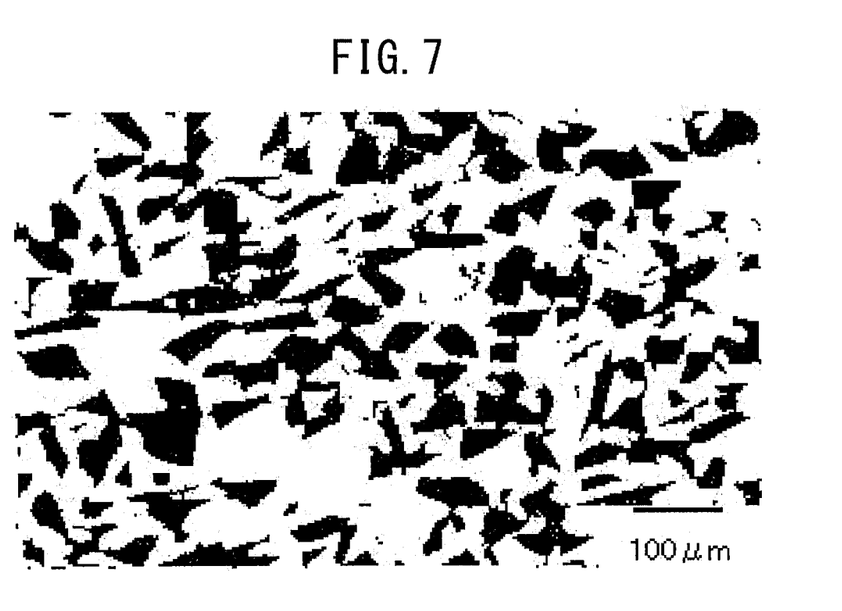
FIG. 7 is a micrograph of the cross-sectional structure of a composite material of Comparative Example 1 which is shown in FIG. 3 which is converted in image by image analysis to make the parts of the particles of silicon carbide black and make the other parts white.

In the results of image conversion of Example 1, as shown in FIG. 6, the black parts (particles of silicon carbide) continue from the top side of FIG. 6 (one surface) to the bottom side (other surface). As opposed to this, in the results of image conversion of Comparative Example 1, as shown in FIG. 7, the black parts (particles of silicon carbide) are separated by the white parts (parts other than silicon carbide).

Measurement of Thermal Conductivity
Further, the composite materials of Example 1 and Comparative Examples 1 to 3 obtained as explained above were measured for thermal conductivity. To measure the thermal conductivity, measurement was performed using a TC-7000 Laser Flash Thermal Constant Measuring Apparatus made by Ulvac Riko Co., Ltd. The measurement results are shown in Table 1. Note that, in the examples, since a thermal conductivity of 180 W/(m·K) is often considered necessary (see Patent Document 6, paragraph [0008]), the reference for evaluation was this value or more.

Measurement of Average Coefficient of Thermal Expansion
Further, the composite materials of Example 1 and Comparative Examples 1 to 3 which were obtained in the above way were measured for average coefficient of thermal expansion of 20° C. to 150° C. The average coefficient of thermal expansion was measured using DL-7000 Thermal Expansion Coefficient Meter made by Ulvac-Riko Co., Ltd. The measurement results are shown in Table 1. Here, in general, the coefficients of thermal expansion of Si (silicon) and GaAs (gallium arsenide) are respectively $4.2 \times 10^{-6}$/° C. and $6.5 \times 10^{-6}$/° C. (see Patent Document 6, paragraph [0003]), so in the examples, $9 \times 10^{-6}$/° C. or less is used as the reference for evaluation.

Measurement of Young's Modulus

Furthermore, the composite materials of Example 1 and Comparative Examples 1 to 3 obtained as explained above were measured for Young's modulus. To measure the Young's modulus, the parts of the aluminum cases were cut off, the materials were supported at three points while causing elastic deformation by a constant load, and the Young's moduli were calculated from the amounts of bending deformations. The measurement results are shown in Table 1.

TABLE 1

|  | Thermal conductivity (W/(m·K)) | Average coefficient of thermal expansion ($10^{-6}$/° C.) | Young's moduli (GPa) |
| --- | --- | --- | --- |
| Example 1 | 181 | 8.4 | 180 |
| Comparative ex. 1 | 120 | 10.5 | 100 |
| Comparative ex. 2 | 151 | 9.8 | 120 |
| Comaparative ex. 3 | 142 | 9.3 | 140 |

As shown in Table 1, the composite material of Example 1 had a thermal conductivity of over 180 W/(m·K) and an average coefficient of thermal expansion at 20° C. to 150° C. of less than $9 \times 10^{-6}$/° C.

In contrast, it is learned that the composite materials of Comparative Examples 1 to 3 had thermal conductivities of all less than 160 W/(m·K) an average coefficients of thermal expansion at 20° C. to 150° C. of all over $9 \times 10^{-6}$/° C. This difference in values is believed to have been caused by the difference in the amount of voids observed in observation of the cross-sectional structure.

Note that, the Young's moduli of the composite materials of Example 1 and Comparative Example 1 to 3 are respectively 180 GPa, 100 GPa, 120 GPa, and 140 GPa. These were all below 190 GPa or preferable results. However, to fabricate composite materials with suitable thermal conductivities and average coefficients of thermal expansion, if using impregnation rather than powder metallurgy, a rise in production costs cannot be avoided. In addition, it is considered that making the Young's modulus of the composite material 190 GPa or less is extremely difficult.

Above, embodiments of the present invention were explained, but the present invention is not limited to this. Various changes and improvements may be made.

REFERENCE SIGNS LIST 1 heat dissipating plate
2 semiconductor device
3 heat sink
4 bolt

The invention claimed is:

1. A method of production of a composite material for a heat dissipating plate, the method comprising:
   a mixing step of mixing a powder of an Al—Si alloy and particles of silicon carbide to obtain a mixture,
   a heating step of heating the mixture filled in an aluminum mold at a temperature of a liquidus temperature of said Al—Si alloy to 650° C. in an atmosphere of air, and
   a forging step of forging the mixture in a semi-molten state where the aluminum alloy is a molten state,
   wherein the particles of silicon carbide contact each other.

2. The method of production of a composite material for a heat dissipating plate according to claim 1, wherein the Al—Si alloy is Al-(7 to 11) mass % Si.

3. The method of production of a composite material for a heat dissipating plate according to claim 1, wherein the forging condition in the forging step is 100 MPa to 300 MPa pressure for 1 second to 20 seconds.

4. The method of production of a composite material for a heat dissipating plate according to claim 1, wherein the mixing step comprises mixing powders of a pure aluminum and an aluminum alloy, and particles of silicon carbide to obtain a mixture.

* * * * *